United States Patent
Peters et al.

(10) Patent No.: US 6,940,755 B2
(45) Date of Patent: Sep. 6, 2005

(54) SEMICONDUCTOR WITH AN IMPROVED READ DEVICE AND OPERATIONAL MODE ASSOCIATED THEREWITH

(75) Inventors: Christian Peters, Vaterstetten (DE); Holger Sedlak, Sauerlach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/768,988

(22) Filed: Jan. 30, 2004

(65) Prior Publication Data

US 2004/0218417 A1 Nov. 4, 2004

Related U.S. Application Data

(63) Continuation of application No. PCT/DE02/02715, filed on Jul. 24, 2002.

(30) Foreign Application Priority Data

Jul. 30, 2001 (DE) .......................................... 101 37 120

(51) Int. Cl.[7] .............................................. G11C 16/04
(52) U.S. Cl. ................................ 365/185.1; 365/185.11; 365/185.12; 365/185.18; 365/185.21; 365/185.24
(58) Field of Search ........................ 365/185.1, 185.11, 365/185.12, 185.18, 185.21, 185.24

(56) References Cited

U.S. PATENT DOCUMENTS

| | | | |
|---|---|---|---|
| 5,182,725 A | * | 1/1993 | Andoh et al. ................ 365/185 |
| 5,970,012 A | | 10/1999 | Takeshima |
| 6,044,033 A | * | 3/2000 | Jang ....................... 365/230.03 |
| 6,052,307 A | | 4/2000 | Huber et al. |
| 6,081,453 A | * | 6/2000 | Iwahashi ................ 365/185.22 |
| 6,128,227 A | | 10/2000 | Kim |
| 6,144,584 A | * | 11/2000 | Kunori et al. .......... 365/185.18 |
| 6,501,684 B1 | * | 12/2002 | Park et al. .............. 365/185.33 |
| 6,563,730 B1 | * | 5/2003 | Poplevine et al. ........... 365/154 |

FOREIGN PATENT DOCUMENTS

EP   1 047 077 A1   10/2000

OTHER PUBLICATIONS

Shibata, N.: "Current Sense Amplifiers for Low–Voltage Memories"; IEICE Trans. Electron, vol. E79–C. No. 8, Aug. 1996; pp. 1120–1130.

* cited by examiner

*Primary Examiner*—Connie C. Yoha
(74) *Attorney, Agent, or Firm*—Darby & Darby

(57) ABSTRACT

A selection transistor for a group of memory cells, preferably composed of 16–32 memory cells, is respectively introduced into the feed lines to the memory cells The selection transistor is opened to a line group for reading, while the control gates of all lines are low potential, and the current for each reading column leading through said line group is measured and stored. In a second step, the control gate of the line to be read is brought to a higher reading potential and the resulting current is compared to the previous current.

3 Claims, 2 Drawing Sheets

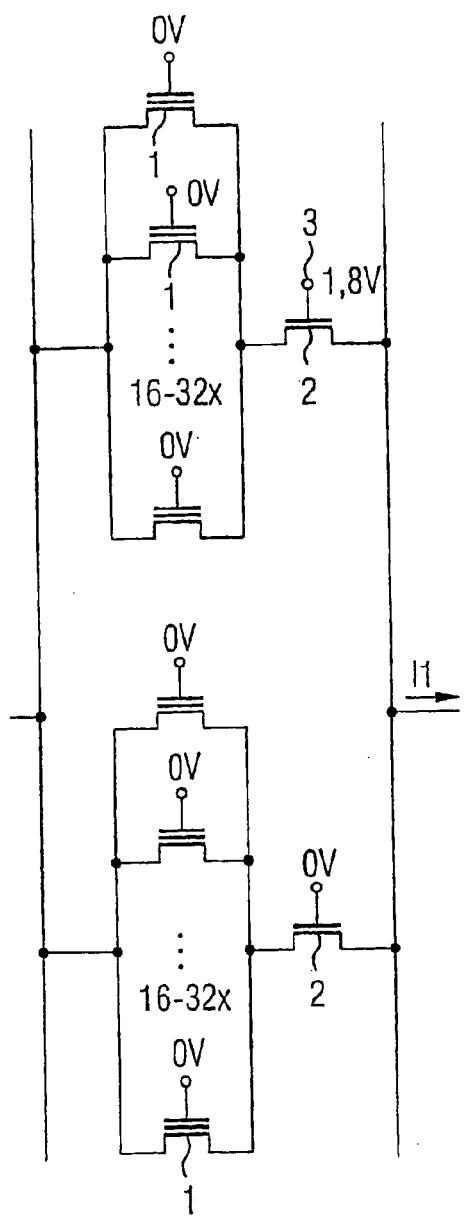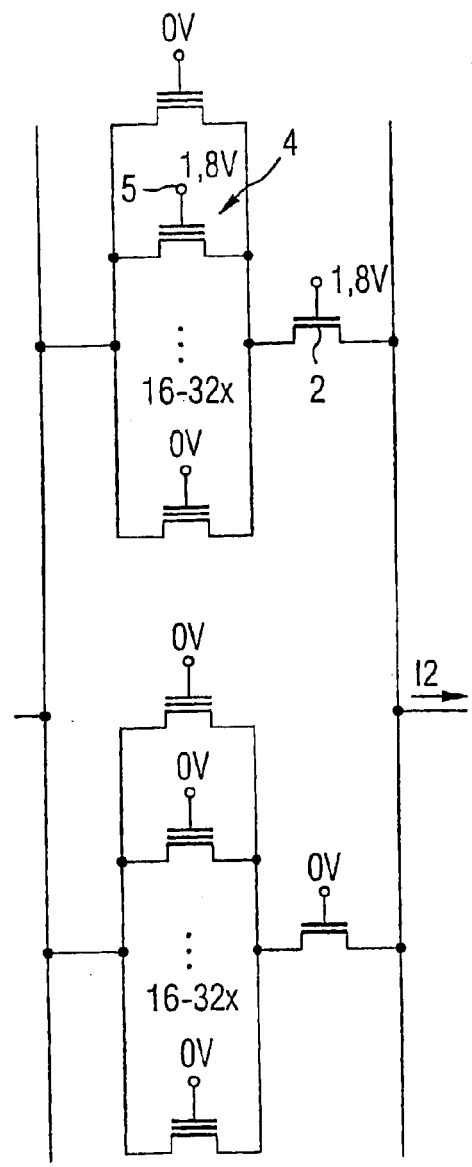

SEMICONDUCTOR WITH AN IMPROVED READ DEVICE AND OPERATIONAL MODE ASSOCIATED THEREWITH

CROSS-REFERENCE TO RELATED APPLICATION

This application claims the benefit of priority under 35 U.S.C. § 365(c) as a continuation of International Application No. PCT/DE02/02715, filed Jul. 24, 2002, which published in German on Feb. 20, 2003 as WO 03/015103.

FIELD OF INVENTION

The present invention relates to floating gate memories and, in particular, to a drive circuit and a differential read concept for non-volatile one-transistor floating gate memories.

BACKGROUND OF THE INVENTION

In a floating gate memory, the information is stored by changing the quantity of charge on the floating gate of the memory transistor by means of one or more high voltages, with the result that the memory transistor conducts or blocks current under specific conditions. During the read-out of the cell, the control gates of all the memory transistors that are not to be read are held at a low potential (e.g., 0 volts), while the control gate of the cell to be read is brought to a higher read potential (e.g., 1.8 volts). A problem in the art is that memory transistors with a positive potential on the floating gate on the same signal line as the memory transistor to be evaluated can also contribute to a read current with a low control gate voltage and, thus, corrupt the read result for the memory cell to be read.

To date, the problem has been solved in that, in cells which are intended to have a conducting information state, the floating gate potential has been set so low that no current flows through them in the non-selected state. A disadvantage of this solution is that the high voltage has to be applied in pulsed fashion, and measured after each pulse to determine whether the cell has already reached the correct floating gate potential. Moreover, for the case where an excessively high floating gate potential is inadvertently reached, it is necessary to provide a recovery mechanism. In addition, the low floating gate potential in the cells reduces the read current and thus the read speed and restricts the read window.

In particular, there is a need for a floating gate memory in which these problems are avoided. The present invention satisfies these and other needs, as set forth in the following description.

SUMMARY OF THE INVENTION

In accordance with one aspect of the invention, a memory cell comprises memory transistors arranged in groups, with each group being assigned a selection transistor. A drive circuit is connected to the memory cell, so that the memory cell can be selected and data can be read and written. The groups of memory transistors can comprise 16 to 32 transistors and can also be arranged in rows and columns.

In accordance with another aspect of the invention, a method for operating a drive circuit comprises the steps of opening a selection transistor for a group of memory transistors, while the gate terminals of the memory transistors are at a low potential. While in this condition a first current for each row or column to be read is measured and stored. The method further comprises raising the potential of a memory transistor gate terminal of a row or column to be read and comparing a resulting second current with the first current.

These and other aspects, features, steps and advantages can be further appreciated from the accompanying drawings and description of certain illustrative embodiments.

BRIEF DESCRIPTION OF THE DRAWING FIGURES

FIG. 1 is a portion of a memory cell which embodies the invention;

FIG. 2 is the memory cell portion of FIG. 1 with a memory transistor selected.

DETAILED DESCRIPTION OF THE ILLUSTRATIVE EMBODIMENTS

Figure 3:
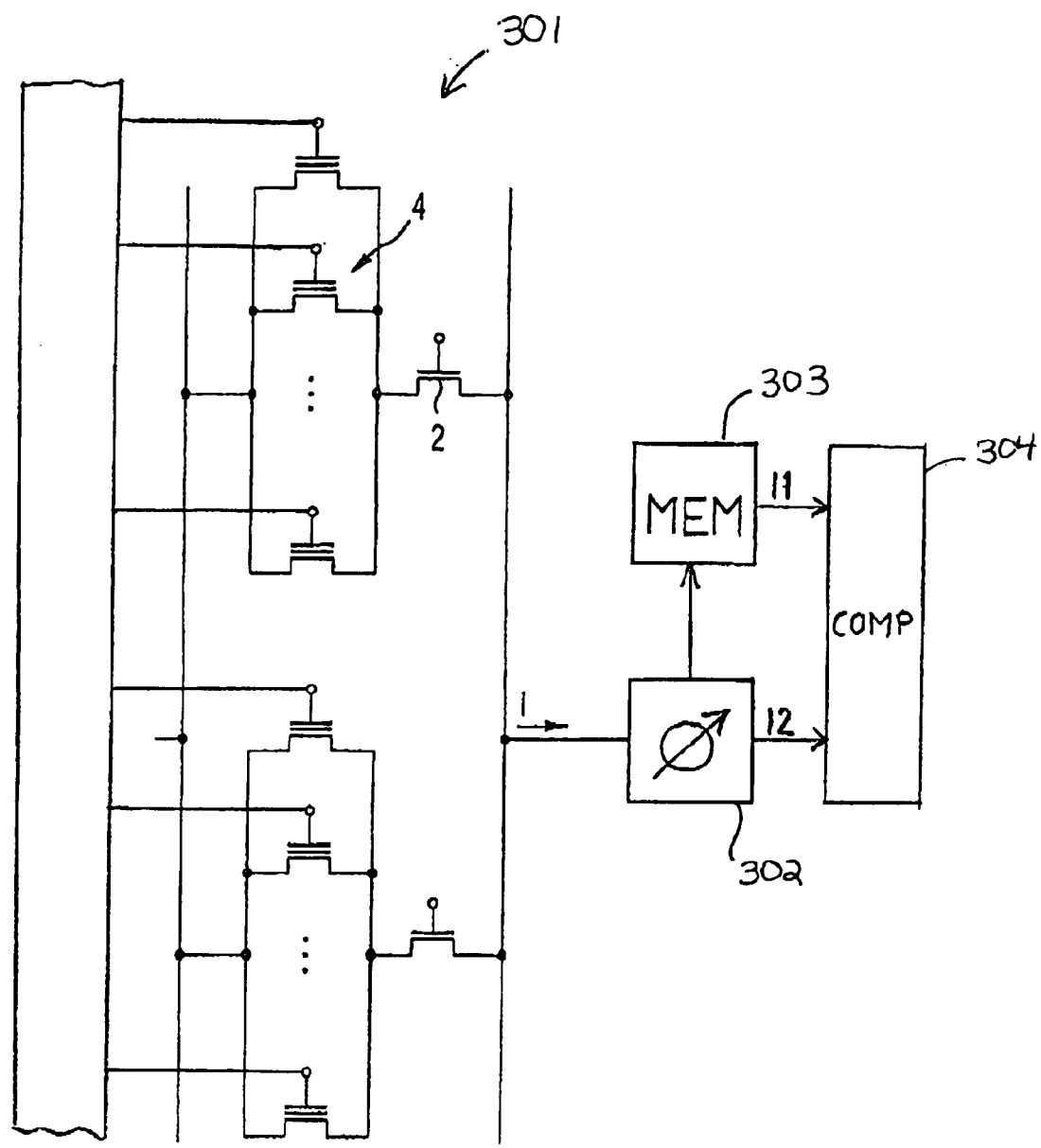
FIG. 3 is a memory according to the invention.

The invention arranges a drive circuit and memory cells to avoid the problems known in the prior art. In an embodiment of the invention a selection transistor 2 for a group of memory cells 1, preferably composed of 16 to 32 memory cells, is inserted into the leads to the memory cells. Since the memory cells in a memory are usually arranged in a matrix-like grid and subdivided into rows and columns, it is assumed, in order to simplify the description, that the group of memory cells, in a preferred exemplary embodiment, forms a row group. However, the arrangement according to the invention may correspondingly be provided if a column group is intended to be addressed in this way, or the designations of rows and columns are interchanged with one another.

For reading, first the selection transistor 2 for a row group is opened, while the control gates of all other rows are at low potential, and the current for each column to be read which leads through said row group is measured and stored. In a second step, the control gate (or control gates) of the row to be read is/are brought to the higher read potential and the resulting current is compared with the previous current. According to the invention, a leakage current through the non-selected cells is not a disturbance, because only the difference between the current with and without a selected cell is taken as a benchmark for a decision about the information of the memory cell.

A preferred embodiment of the invention is described below with reference to FIGS. 1 and 2, which illustrate the two steps of the read operation using a detail from the memory cell arrangement.

FIG. 1 illustrates a detail from a memory cell array in which the memory transistors 1 can be jointly selected in a groupwise manner in each case by means of a selection transistor 2. FIG. 1 depicts two such groups of 16 to 32 memory transistors, which are each connected to a selection transistor 2. The selection transistor 2 depicted at the top in FIG. 1 has been opened by the application of a potential of typically 1.8 volts to the gate terminal 3, so that the associated memory transistors can be read. Because all these memory transistors are still blocked with a gate potential of 0 volts, initially only the output current I1 flows.

FIG. 2 illustrates the next step of the read operation, in which the gate terminal 5 of a selected memory transistor 4 is put at typically 1.8 volts. The memory content of this transistor can therefore be read out, so that now an output current I2 flows.

FIG. 3 illustrates a memory according to the invention. The memory as shown has on the left side a means for supplying a read potential to gate terminals of the row and column to be read 301, and on the right side a means for measuring a first current 302, a means for storing the measured first current 303, a means for measuring a resulting second current 302, and a means for comparing the second current with the stored first current 304.

Thus, while there have been shown, described, and pointed out fundamental novel features of the invention, it will be understood that various omissions, substitutions, and changes in the form and details of the devices illustrated, and in their operation, may be made by those skilled in the art without departing from the spirit and scope of the invention. Substitutions of elements from one described embodiment to another are also fully intended and contemplated. It is also to be understood that the drawings are not necessarily drawn to scale, but that they are merely conceptual in nature. The invention is defined solely with regard to the claims appended hereto, and equivalents of the recitations therein.

We claim:

1. A method for operating a memory, comprising the steps of:
   providing memory transistors arranged in a group of at least one of a row and a column;
   providing a drive circuit coupled to a memory transistor of the group so that information can be written to and read from the memory transistor;
   providing a selection transistor coupled with the group of memory transistors so that the group of memory transistors can be jointly selected;
   applying a high potential to the gate terminal of the selection transistor while gate terminals of the memory transistors of the group of memory transistors are at low potential;
   measuring a first current flowing through each row or column to be read;
   storing the measured first current;
   supplying a read potential to gate terminals of the row or column to be read;
   measuring a resulting second current flowing through the row or column to be read; and
   comparing the second current with the stored first current.

2. A memory comprising:
   means for providing memory transistors arranged in a group of at least one of a row and a column;
   means for providing a drive circuit coupled to a memory transistor of the group so that information can be written to and read from the memory transistor;
   means for providing a selection transistor coupled with the group of memory transistors so that the group of memory transistors can be jointly selected;
   means for applying a high potential to the gate terminal of the selection transistor while gate terminals of the memory transistors of the group of memory transistors are at low potential;
   means for measuring a first current flowing through each row or column to be read;
   means for storing the measured first current;
   means for supplying a read potential to gate terminals of the row or column to be read;
   means for measuring a resulting second current flowing through the row or column to be read; and
   means for comparing the second current with the stored first current.

3. A method for operating a memory having memory transistors arranged in a group, a drive circuit coupled to a memory transistor of the group so that information can be written to and read from the memory transistor, and a selection transistor coupled with the group of memory transistors so that the group of memory transistors can be jointly selected, the method comprising the steps of:
   applying a high potential to the gate terminal of the selection transistor while gate terminals of the memory transistors of the group of memory transistors are at low potential;
   measuring a first current flowing through each row or column to be read;
   storing the measured first current;
   supplying a read potential to gate terminals of the row or column to be read;
   measuring a resulting second current flowing through the row or column to be read; and
   comparing the second current with the stored first current.

* * * * *